(12) United States Patent
Cheng

(10) Patent No.: US 8,358,230 B2
(45) Date of Patent: Jan. 22, 2013

(54) LOW POWER DISCRETE-TIME ELECTRONIC CIRCUIT

(75) Inventor: Ting-Yuan Cheng, Hsinchu County (TW)

(73) Assignee: RichWave Technology Corp., Taipei (TW)

( * ) Notice: Subject to any disclaimer, the term of this patent is extended or adjusted under 35 U.S.C. 154(b) by 154 days.

(21) Appl. No.: 13/095,913

(22) Filed: Apr. 28, 2011

(65) Prior Publication Data

US 2012/0274400 A1    Nov. 1, 2012

(51) Int. Cl.
*H03M 1/66* (2006.01)

(52) U.S. Cl. ......................................... 341/144; 341/155

(58) Field of Classification Search .................. 341/144, 341/145, 155
See application file for complete search history.

(56) References Cited

U.S. PATENT DOCUMENTS

| 6,879,276 B2 * | 4/2005 | Devendorf et al. ........... 341/144 |
| 7,231,195 B2 * | 6/2007 | Nakayama ................. 455/251.1 |

* cited by examiner

*Primary Examiner* — Jean B Jeanglaude
(74) *Attorney, Agent, or Firm* — Winston Hsu; Scott Margo

(57) ABSTRACT

A low power discrete-time electronic circuit includes an amplifier, and a variable current supply. The variable current supply is electrically connected to the amplifier, and is utilized for supplying high current to the amplifier during a switching operation and supplying low current to the amplifier during a non-switching period.

14 Claims, 9 Drawing Sheets

US 8,358,230 B2

LOW POWER DISCRETE-TIME ELECTRONIC CIRCUIT

BACKGROUND OF THE INVENTION

1. Field of the Invention

The present invention relates to discrete-time electronic circuits, and more particularly, to a low power discrete-time electronic circuit with a variable power supply.

2. Description of the Prior Art

Electronic circuits are key components in a plethora of consumer, industrial, and military devices and systems. With each generation of circuit technology, electronic circuits generally shrink in size, gain speed, and consume less power. For mobile devices, low power consumption is a key requirement.

Mixed signal circuits, such as analog to digital converters (ADCs), digital to analog converters (DACs), are used in a wide range of products. Many architectures are available with their respective trade-offs. One such architecture is a discrete-time architecture, which is popular for its high integrability and precision. FIG. 1 is a diagram illustrating two stages 110, 120 of a pipeline ADC 10. Sub-ADCs 111, 121 receive input signals, and output a digital bit based on level of the input signal received, e.g. 1 or 0, or −1, 0, or +1. The digital bits are combined by digital combiner circuits 130 to output a digital sequence representing magnitude of the analog input signal. Each stage 110, 120 also includes a multiplying DAC (MDAC) 112, 122 that outputs an analog signal having a level corresponding to the digital bit outputted by the respective sub-ADC 111, 121. Adders 113, 123 combine the original input signal with the analog signal from the MDAC 112, 122, and the combined signal is amplified by a gain stage 114, 124 for output to the next stage. In practice, the MDAC 112, 122 may be responsible for the functions of the adder 113, 123 and the gain stage 114, 124. Also, each pair of stages 110, 120 may share one MDAC. Thus, the MDACs 112, 122 may be a single, shared MDAC.

FIG. 2 illustrates operation of the first-stage sub-ADC 111 in a first phase Φ1 and a second phase Φ2, and operation of a second-stage sub-ADC 121 in the first phase Φ1 and the second phase Φ2. For the first-stage sub-ADC 111, in the first phase Φ1, differential input capacitors C1, C2 are charged by differential input signals INP, INN, and output of an amplifier 1111 is latched by a latch 1112 at transition from phase Φ1 to phase Φ2. In the second phase Φ2, the differential input capacitors C1, C2 are electrically connected to offset voltages (Vref−Vcm), (Vrefb−Vcm) respectively. For the second-stage sub-ADC 121, in the first phase Φ1, differential input capacitors C3, C4 are electrically connected to offset voltages (Vref−Vcm), (Vrefb−Vcm) respectively. In the second phase Φ2, the differential input capacitors C3, C4 are charged by differential input signals INP, INN, and output of an amplifier 1211 is latched by a latch 1212 at transition from phase Φ2 to phase Φ1.

FIG. 3 illustrates operation of the MDACs 112, 122 of FIG. 1, where the MDACs 112, 122 are a single, shared MDAC. In the first phase Φ1, capacitors C5, C6 are charged by input signals INP, INN, and capacitors C7, C10 are charged by reference signals −VREF, +VREF, respectively. In the second phase Φ2, the capacitors C5, C6 are switched at their outputs to electrically connect to an amplifier 150 for amplification, and are switched at their inputs to reference signals +VREF, Vcm, or −VREF based on outputs of the sub-ADCs 111, 121. Output terminals of the capacitors C7, C10 are switched to outputs of the amplifier 150, and input terminals of the capacitors C7, C10 are switched to Vcm. Thus, the MDACs 112, 122 share the amplifier 150 to perform digital to analog conversion, addition/subtraction, and amplification.

Please refer to FIG. 4, which is a diagram illustrating operating current of the amplifiers 1111, 1211, 150 throughout the various phases Φ1, Φ2 described above. As shown in FIG. 4, fixed high current is supplied in each operating phase of the pipeline ADC 10, such that the pipeline ADC 10 does not provide significant power savings to the user.

SUMMARY OF THE INVENTION

According to an embodiment, a low power discrete-time electronic circuit comprises an amplifier, and a variable current supply electrically connected to the amplifier circuit for supplying high current to the amplifier during a switching operation, and supplying low current to the amplifier during a non-switching period.

According to an embodiment, a variable current supply is for supplying high current to a discrete-time electronic circuit during a switching operation of the discrete-time electronic circuit, and supplying low current to the discrete-time electronic circuit during a non-switching period of the discrete-time electronic circuit. The variable current supply comprises a low current source electrically connected to the discrete-time electronic circuit for supplying low current to the discrete-time electronic circuit, and a switchable additive current source electrically connected in parallel with the low current source for supplying additional current to the discrete-time electronic circuit during the switching operation of the discrete-time electronic circuit. The high current comprises the low current and the additional current.

According to an embodiment, a method of powering a discrete-time electronic circuit comprises providing high current to the discrete-time electronic circuit during a switching operation of the discrete-time electronic circuit, and providing low current to the discrete-time electronic circuit preceding and following the switching operation.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
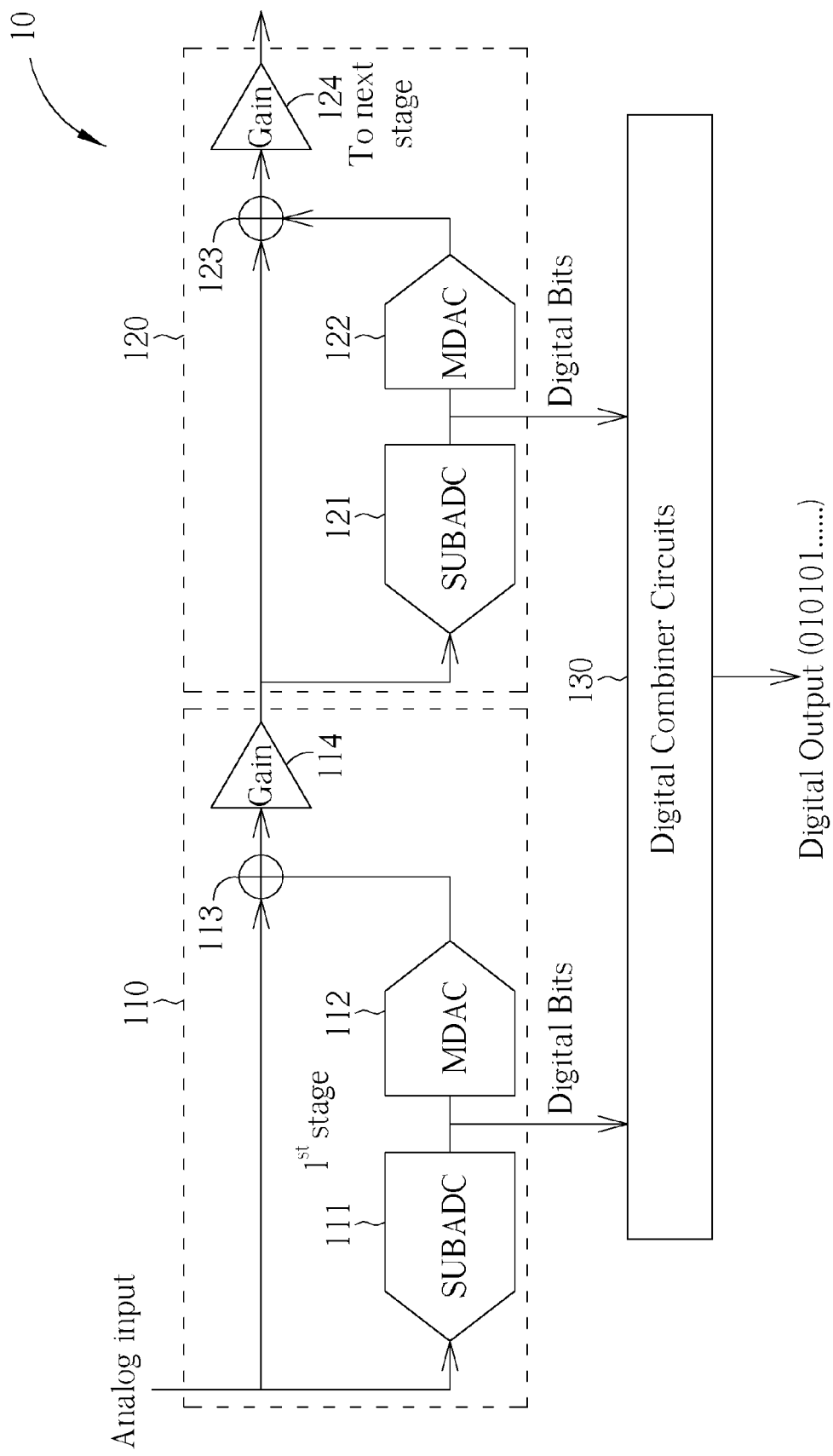
FIG. 1 is a diagram illustrating two stages of a pipeline ADC.
Figure 2:
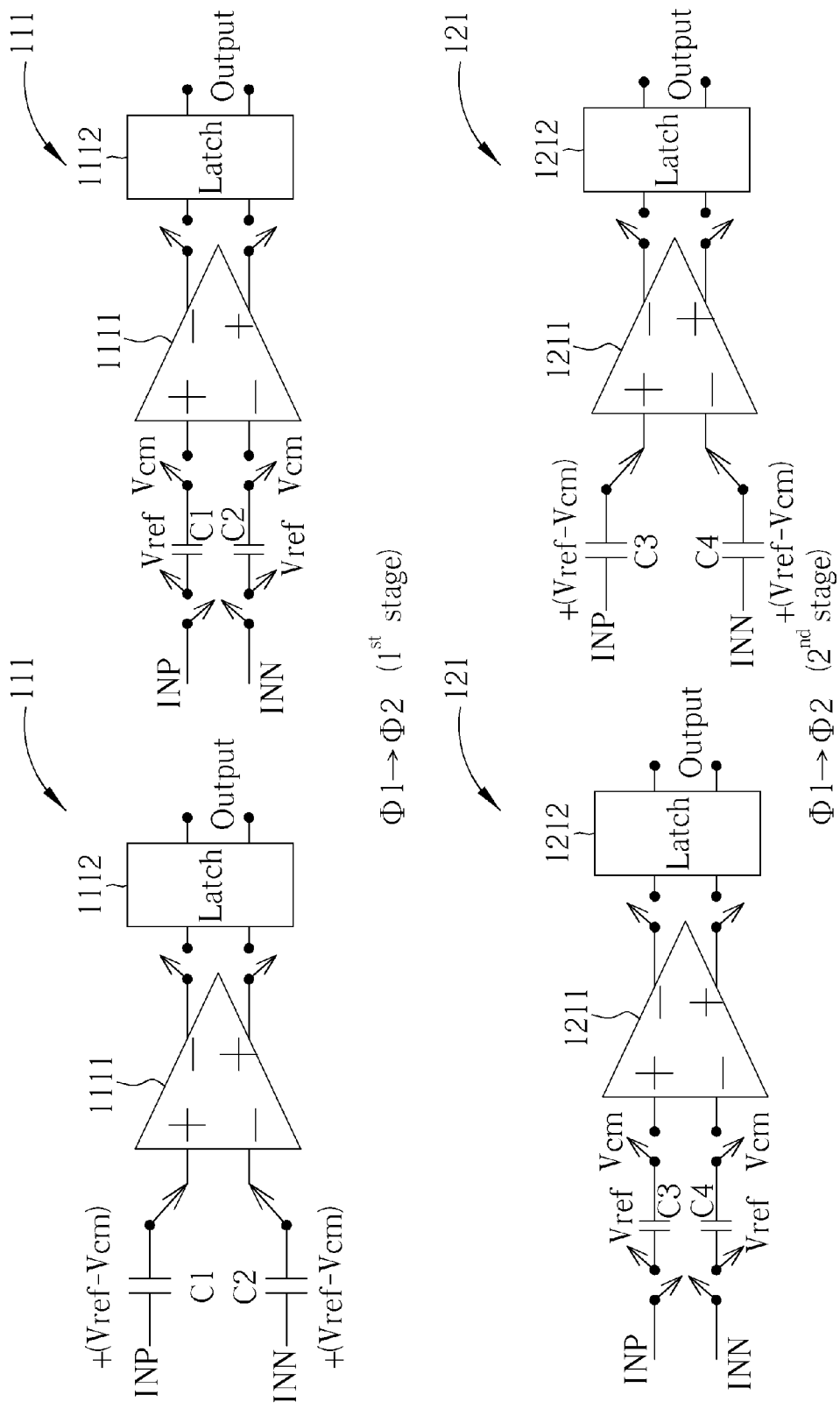
FIG. 2 illustrates operation of the first-stage sub-ADC and the second-stage sub-ADC in a first phase and a second phase.
Figure 3:
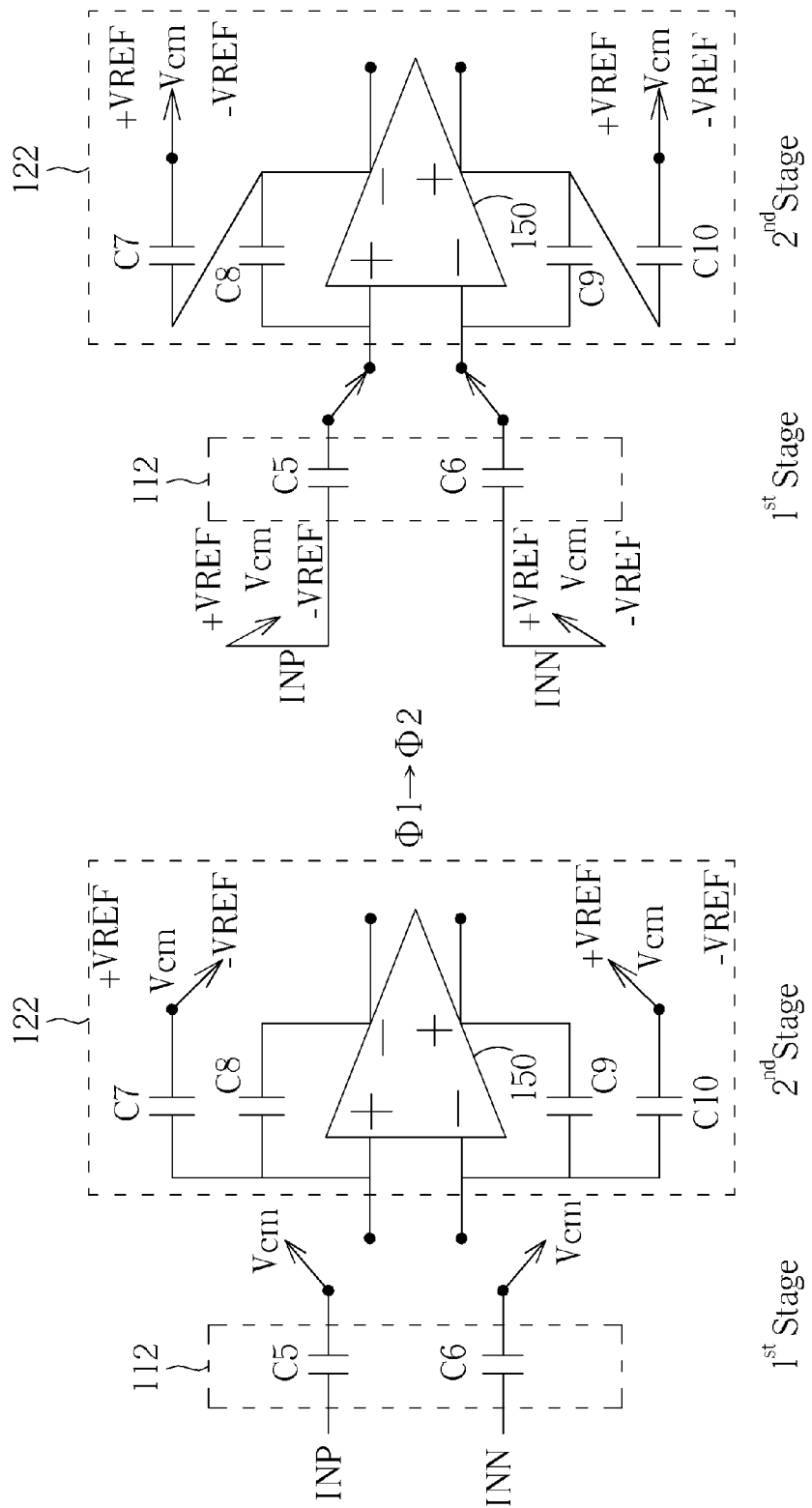
FIG. 3 illustrates operation of the MDACs of FIG. 1.
Figure 4:
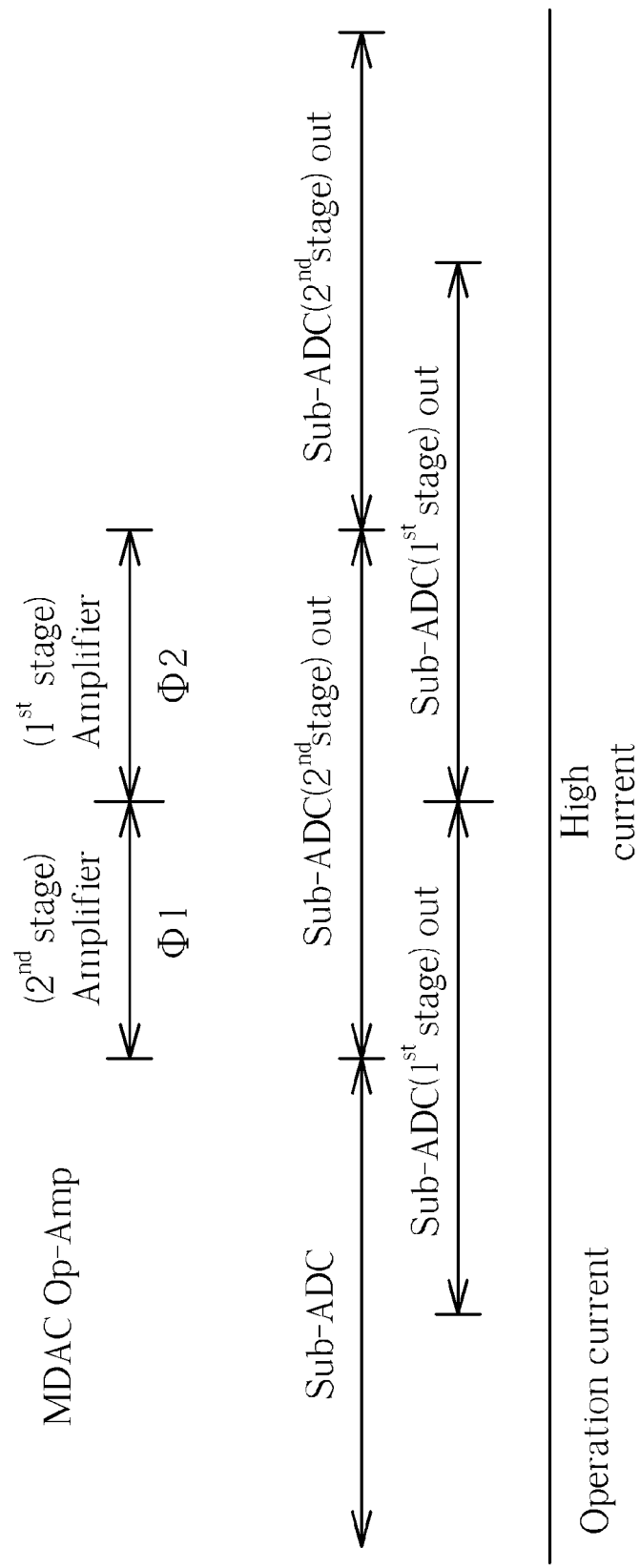
FIG. 4 is a diagram illustrating operating current of the amplifiers throughout the various phases.
Figure 5:
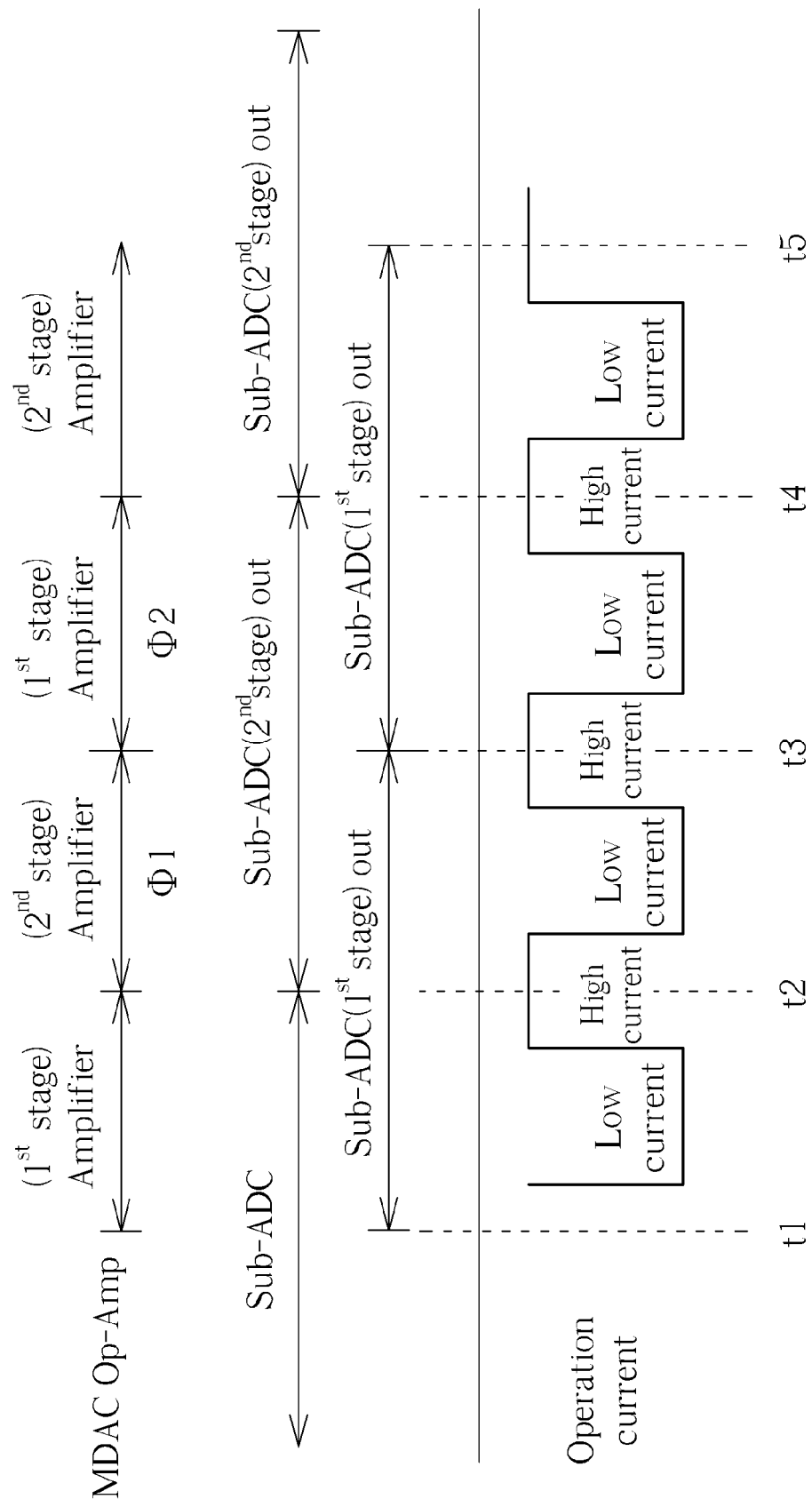
FIG. 5 is a diagram illustrating a power-saving scheme according to an embodiment.
Figure 8:
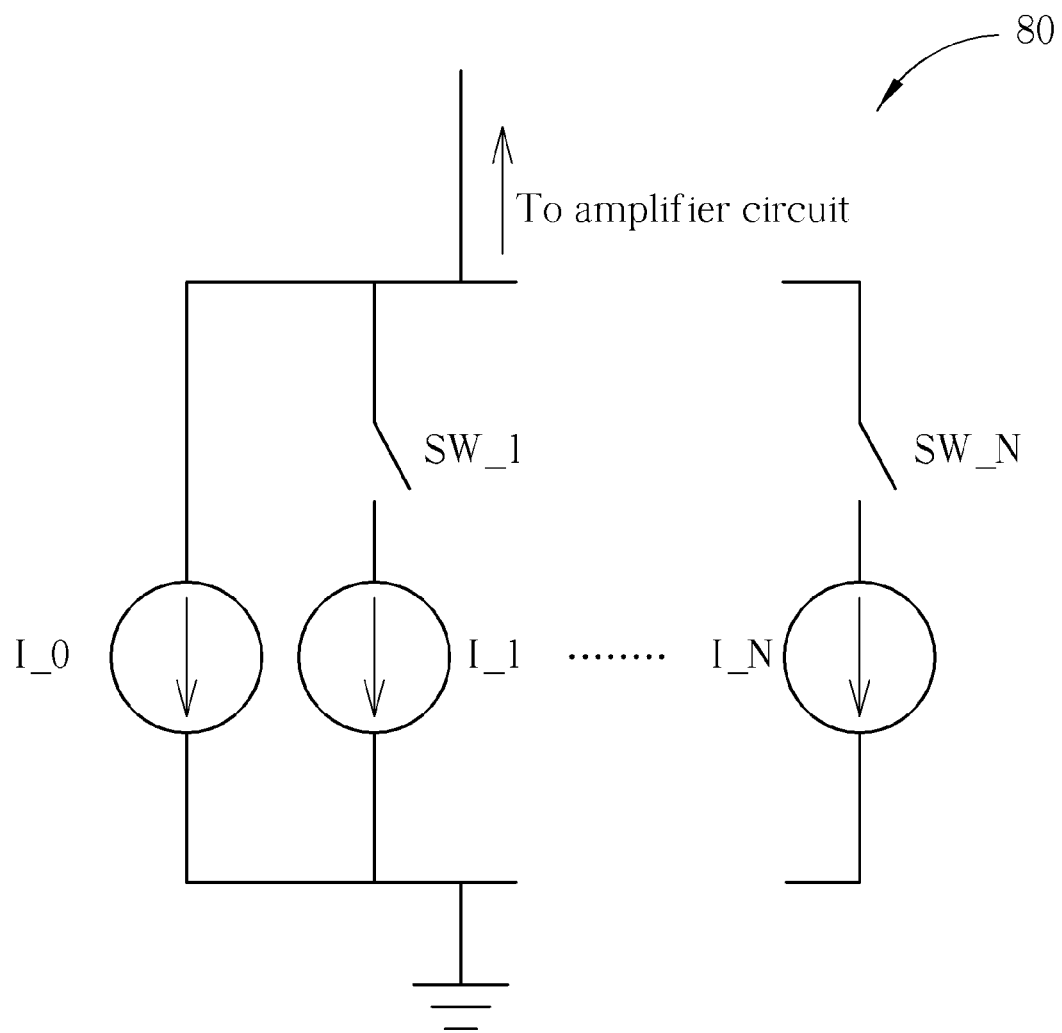
FIG. 8 is a diagram of a variable current supply for powering an amplifier circuit.

Please refer to FIG. 5, which is a diagram illustrating a power-saving scheme according to an embodiment. The power-saving scheme is illustrated with reference to the pipeline ADC 10 of FIG. 1. However, it should be recognized that the power-saving scheme is applicable to various families of discrete-time electronic circuits. Further, the pipeline ADC 10 having fixed high current could not directly utilize the power-saving scheme of FIG. 5, but would require modification, as shown in FIG. 8.

One reason for operating the amplifiers 1111, 1211, 150 at the high current is to provide sufficient gain and response time during switching of the capacitors C1-C4, C5-C7, C10. However, following the switching operations, requirements for performance characteristics of the amplifiers 1111, 1211, 150 drop off significantly. Thus, the power-saving scheme shown in FIG. 5 takes advantage of the lowered requirements to save power between switching operations. As shown in FIG. 5, at times t1-t5, switching occurs in the first-stage sub-ADC 111, the second-stage sub-ADC 121, and/or the MDACs 112, 122. At times t1, t3, t5 switching occurs in the first stage sub-ADC 111. At times t2, t4 switching occurs in the second stage sub-ADC 111. Switching occurs in the MDACs 112, 122 at each of the times t1-t5. As shown in FIG. 5, operating current of the amplifiers 1111, 1211, 150 is dropped to a low current after each switching operation, and is raised to a high current prior to each switching operation. As long as the amplifiers 1111, 1211, 150 are powered at the high current level for the duration of each switching operation, the amplifiers 1111, 1211, 150 may be powered down to the low current level at any other time. As shown, the high current may be supplied a predetermined period of time preceding each switching operation, and may be cut off a predetermined period of time following each switching operation in order to compensate for slew rates and settling times of the various components. The high current is supplied during switching operations, and the low current is supplied during non-switching periods. In the above, it should be noted that the high and low currents may not be the same for each of the amplifiers 1111, 1211, 150 due to various requirements of the sub-ADCs 111, 121 and the MDACs 112, 122.

Figure 6:
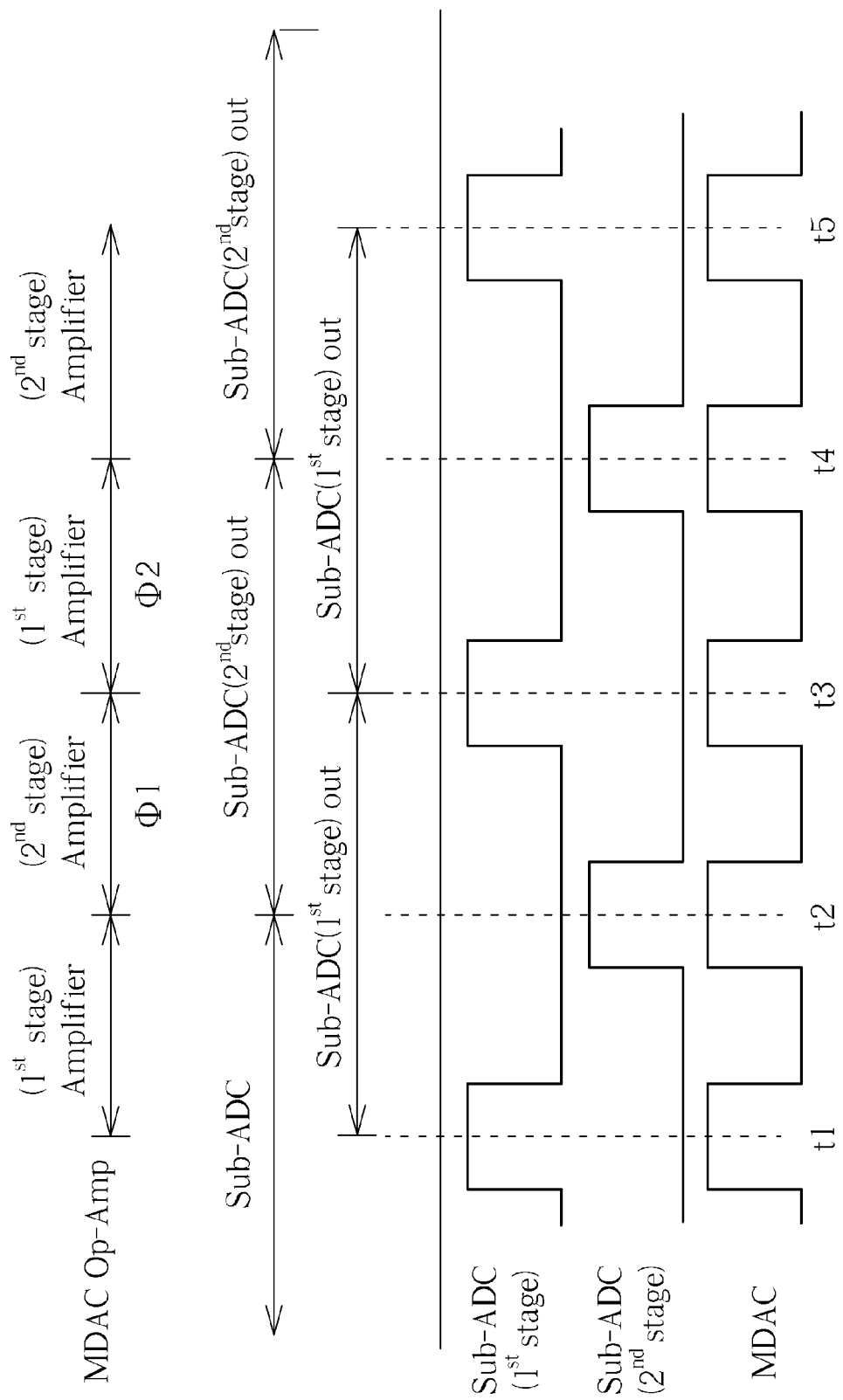
FIG. 6 is a diagram illustrating a power-saving scheme according to another embodiment.

Please refer to FIG. 6, which is a diagram illustrating a power-saving scheme according to another embodiment. Whereas the embodiment shown in FIG. 5 accomplishes power savings through a single control signal that powers the amplifiers 1111, 1211, 150 with the high current simultaneously, the embodiment shown in FIG. 6 recognizes that each amplifier 1111, 1211, 150 may operate under different switching cycles, and thus utilizes three control signals to provide further power savings. As shown in FIG. 6, at times t1, t3, t5, the first sub-ADC 111 undergoes switching, and is powered by the high current, whereas the second sub-ADC 121 does not undergo switching, and is thus powered by the low current. At times t2, t4, the second sub-ADC 121 undergoes switching, and is powered by the high current, whereas the first sub-ADC 111 does not undergo switching, and is thus powered by the low current. The MDACs 112, 122 undergo switching at each of the times t1-t5, and are thus powered by the high current at each of the times t1-t5. As shown, the high current may be supplied a predetermined period of time preceding each switching operation, and may be cut off a predetermined period of time following each switching operation in order to compensate for slew rates and settling times of the various components.

Figure 7:
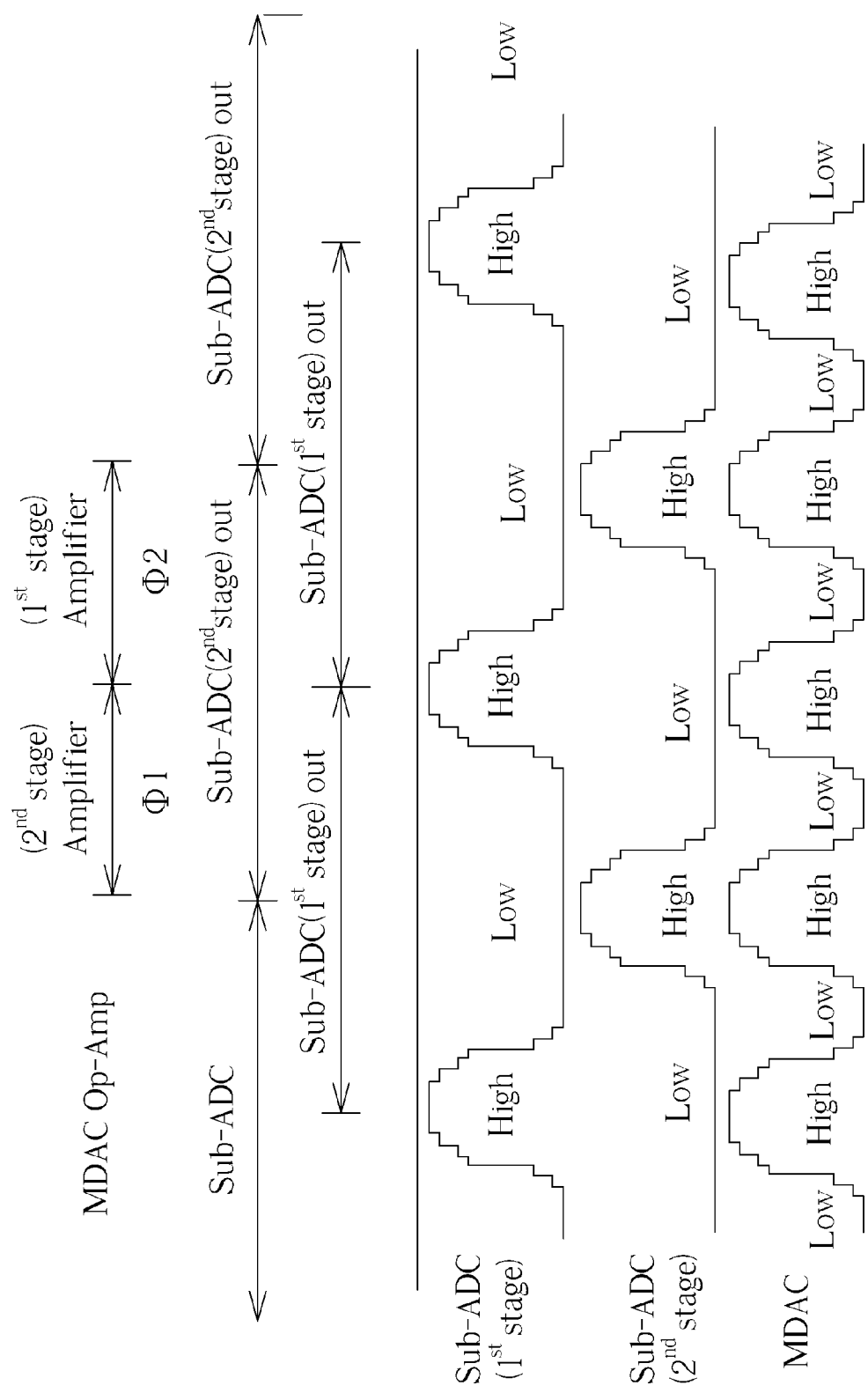
FIG. 7 is a diagram illustrating a power-saving scheme according to another embodiment.

Please refer to FIG. 7, which is a diagram illustrating a power-saving scheme according to another embodiment. The power-saving scheme shown in FIG. 7 is similar to that shown in FIG. 6. The embodiment shown in FIG. 7 recognizes that each amplifier 1111, 1211, 150 may operate under different switching cycles, and thus utilizes multiple control signals to provide the further power savings. The embodiment shown in FIG. 7 is characterized by utilizing smoothed transitions between the low current and the high current. For example, as shown in FIG. 7, six discrete current levels are utilized to increase the supply currents from the low current to the high current, and to decrease the supply currents from the high current to the low current. The discrete current levels may have magnitude lower than the high current and higher than the low current. Number of discrete current levels is not limited to six. The discrete current levels are not limited to having the same magnitudes for transitions from low to high as from high to low. Number and magnitudes of the discrete current levels may be different for different circuits receiving the supply currents, e.g. the amplifiers 1111, 1211, 150.

Please refer to FIG. 8, which is a diagram of a variable current supply 80 for powering an amplifier circuit, such as any of the amplifiers 1111, 1211, 150 described above. The variable current supply 80 may be utilized to vary supply current as shown in FIG. 5, FIG. 6, and FIG. 7, and comprises a low current source I_0, and a plurality of additive current sources I_1-I_N. The variable current supply 80 may optionally comprise the low current source I_0 and the additive current source I_1. Each additive current source I_1-I_N may be controlled independently by a corresponding switch SW_1-SW_N. In another embodiment, the additive current sources I_1-I_N may be controlled by a single control signal, turning on or off simultaneously. In practice, each switch SW_1-SW_N may be realized as a transistor, such as a metal-oxide-semiconductor (MOS) transistor or a bipolar junction transistor (BJT). The low current source I_0 may supply a minimum operation current for powering the amplifier 1111, 1211, 150. The additive current source(s) I_1-I_N may combine with the low current source I_0 to supply the high current described above. The low current source I_0 and the additive current sources I_1-I_N may be the same size or different sizes.

Figure 9:
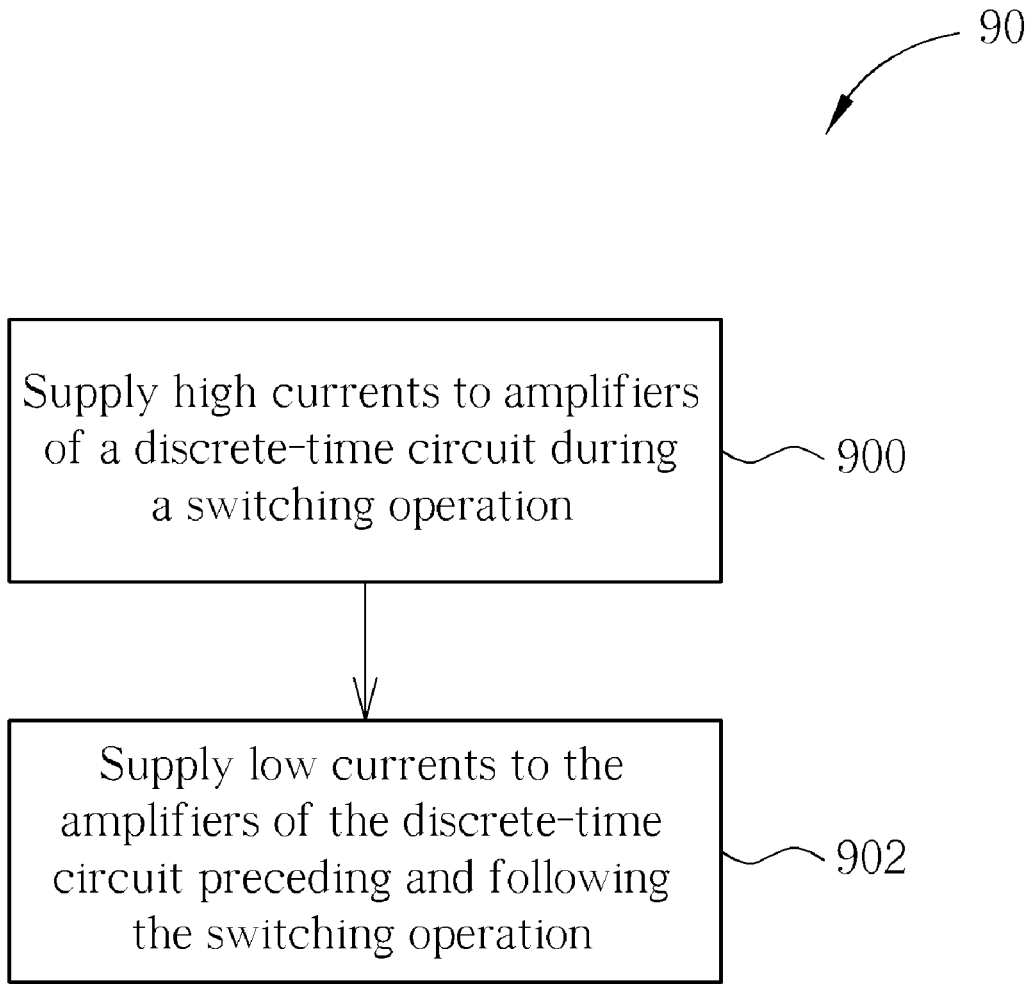
FIG. 9 is a flowchart of a process for powering the amplifiers according to an embodiment.

Please refer to FIG. 9, which is a flowchart of a process 90 for powering the amplifiers 1111, 1211, 150 according to an embodiment. The process 90 may be applied to the pipeline ADC 10 modified by the variable current supply 80 of FIG. 8, and comprises the following steps:

Step 900: Supply high currents to amplifiers of a discrete-time electronic circuit during a switching operation; and Step 902: Supply low currents to the amplifiers of the discrete-time electronic circuit preceding and following the switching operation.

In Step 900, the high currents may be supplied to the amplifiers 1111, 1211, 150 as shown in FIG. 5, as shown in FIG. 6, or as shown in FIG. 7. In Step 902, the low currents may be supplied to the amplifiers 1111, 1211, 150 as shown in FIG. 5, as shown in FIG. 6, or as shown in FIG. 7. The high currents may be the same or different. The low currents may be the same or different.

The power schemes and the variable current source described above save power in discrete-time electronic circuits by only providing high current during switching operations, and providing low current outside of switching operations.

Those skilled in the art will readily observe that numerous modifications and alterations of the device and method may be made while retaining the teachings of the invention.

What is claimed is:

1. A low power discrete-time electronic circuit comprising:
   an amplifier; and
   a variable current supply electrically connected to the amplifier for supplying high current to the amplifier during a switching operation, and supplying low current to the amplifier during a non-switching period.

2. The low power discrete-time electronic circuit of claim 1, wherein the variable current supply comprises:
   a low current source electrically connected to the amplifier for supplying low current to the amplifier; and
   a switchable additive current source electrically connected in parallel with the low current source for supplying additional current to the amplifier;
   wherein the high current comprises the low current and the additional current.

3. The low power discrete-time electronic circuit of claim 2, wherein the switchable additive current source comprises:
   a current source; and
   a switch electrically connected between the current source and the discrete-time electronic circuit.

4. The low power discrete-time electronic circuit of claim 2, wherein the switchable additive current source comprises:
   a plurality of current sources; and
   a plurality of switches, each switch electrically connected between a corresponding current source of the plurality of current sources and the discrete-time electronic circuit.

5. A variable current supply for supplying high current to a discrete-time electronic circuit during a switching operation of the discrete-time electronic circuit, and supplying low current to the discrete-time electronic circuit during a non-switching period of the discrete-time electronic circuit, the variable current supply comprising:
   a low current source electrically connected to the discrete-time electronic circuit for supplying low current to the discrete-time electronic circuit; and
   a switchable additive current source electrically connected in parallel with the low current source for supplying additional current to the discrete-time electronic circuit during the switching operation of the discrete-time electronic circuit;
   wherein the high current comprises the low current and the additional current.

6. The variable current supply of claim 5, wherein the switchable additive current source comprises:
   a current source; and
   a switch electrically connected between the current source and the discrete-time electronic circuit.

7. The variable current supply of claim 5, wherein the switchable additive current source comprises:
   a plurality of current sources; and
   a plurality of switches, each switch electrically connected between a corresponding current source of the plurality of current sources and the amplifier.

8. A method of powering a discrete-time electronic circuit, the method comprising:
   providing high current to the discrete-time electronic circuit during a switching operation of the discrete-time electronic circuit; and
   providing low current to the discrete-time electronic circuit preceding and following the switching operation.

9. The method of claim 8, wherein providing the high current to the discrete-time electronic circuit during the switching operation of the discrete-time electronic circuit is:
   providing the high current to a first sub-analog-to-digital-converter (sub-ADC) of the discrete-time electronic circuit during a switching operation of the first sub-ADC; and
   providing the high current to a second sub-ADC of the discrete-time electronic circuit and providing low current to the first sub-ADC of the discrete time circuit during a switching operation of the second sub-ADC.

10. The method of claim 8, wherein providing the high current to the discrete-time electronic circuit during the switching operation of the discrete-time electronic circuit comprises providing the high current to a multiplying digital-to-analog converter (MDAC) of the discrete-time electronic circuit during a switching operation of the MDAC.

11. The method of claim 10, wherein providing the low current to the discrete-time electronic circuit preceding and following the switching operation comprises providing the low current to the MDAC during a non-switching period of the MDAC.

12. The method of claim 8, wherein providing the high current to the discrete-time electronic circuit during the switching operation of the discrete-time electronic circuit comprises providing the high current to sub-analog-to-digital-converters (sub-ADCs) of the discrete-time electronic circuit during a switching operation of the sub-ADCs.

13. The method of claim 12, wherein providing the low current to the discrete-time electronic circuit preceding and following the switching operation comprises providing the low current to the sub-ADCs during a non-switching period of the sub-ADCs.

14. The method of claim 8, further comprising:
   providing current at a first plurality of discrete current levels between the low current and the high current when transitioning from providing the low current to providing the high current; and
   providing current at a second plurality of discrete current levels between the low current and the high current when transitioning from providing the high current to providing the low current.

* * * * *